181-198 SR

FIP8110 XR 4,122,910

United States Patent [19]

Wehner

[11] 4,122,910

[45] Oct. 31, 1978

[54] OMNIPHONIC MICROPHONE AND LOUDSPEAKER SYSTEM

[76] Inventor: Raymond Wehner, 241 Eveline St., Selkirk, Canada

[21] Appl. No.: 774,451

[22] Filed: Mar. 4, 1977

[30] Foreign Application Priority Data

Mar. 16, 1976 [GB] United Kingdom ............... 10502/76

[51] Int. Cl.$^2$ ............................................... H05K 5/00

[52] U.S. Cl. .................................... 181/144; 181/148; 181/154; 181/198; 181/199

[58] Field of Search ............... 181/141, 143, 144, 145, 181/146, 147, 148, 150, 153, 154, 155, 199, 198

[56] References Cited

U.S. PATENT DOCUMENTS

| | | | |
|---|---|---|---|
| 2,969,848 | 1/1961 | Farwell | 181/145 |
| 3,815,707 | 6/1974 | Burhoe | 181/199 |
| 4,006,308 | 2/1977 | Pönsgen | 181/147 |

*Primary Examiner*—L. T. Hix
*Assistant Examiner*—Benjamin R. Fuller
*Attorney, Agent, or Firm*—Stanley G. Ade

[57] ABSTRACT

A triaxial or four-dimensional radiant energy transducer system is embodied in an omniphonic microphone and loudspeaker system as it relates to the sound spectrum. This is a system which is capable of detecting the location and direction of a source of sound and, conversely, is capable of re-presenting the location and direction of that source of sound.

12 Claims, 13 Drawing Figures

LOUDSPEAKER

MICROPHONE

BASIC TETRAHEDRAL SHAPE

OMNIPHONIC MICROPHONE AND LOUDSPEAKER SYSTEM

BACKGROUND OF THE INVENTION

This invention relates to new and useful improvements in omniphonic microphone and loudspeaker systems.

The old method or system comprises one of the following:

(a) Natural hearing, (b) Stereophonic listening and recording devices, (c) Stereophonic listening and recording devices utilizing two or more microphones with passive or active playback circuitry to decode the ambience component of the recording, (d) Quadraphonic listening and recording devices utilizing four or more microphones with:

(i) discreet four-channel recording and play-back;

(ii) encoding/decoding on two-channel devices with effects similar to (i) — apart from natural hearing the above methods allow for recording and playback in two planes, i.e., horizontal and saggital.

(e) The kunstkopf, Germany for artificial head, allows for recording and play-back in all planes, i.e., horizontal, vertical and saggital.

SUMMARY OF THE INVENTION

The present invention overcomes disadvantages inherent with conventional systems and one aspect of the invention is to provide a transducer system for use in a sound system comprising in combination a tetrahedron support module, said module including four panels assembled to form said tetrahedron, a pair of transducers mounted one in each of two of said panels which are adjacent one another, said transducers being mounted on a horizontal line of sight and rotated 180° one with the other.

As will be seen, the microphone or pick-up portion of the invention is similar in construction and operation to the loudspeaker or output transducer portion of the system, the only difference being the orientation of the support module.

The present system is capable of detecting the location and direction of a source of sound and conversely, is capable of re-presenting the location and direction of that source of sound.

With the foregoing objects in view, and other such objects and advantages as will become apparent to those skilled in the art to which this invention relates as this specification proceeds, my invention consists essentially in the arrangement and construction of parts all as hereinafter more particularly described, reference being had to the accompanying drawings in which:

BRIEF DESCRIPTION OF THE DRAWINGS

In the drawings like characters of reference indicate corresponding parts in the different figures.

BRIEF DESCRIPTION

Before proceeding with details of the construction of the invention, the following theoretical considerations should be considered.

It may be assumed that minimum interference with propagation of a sound wave by an intervening mass will occur if:

(1) the mass is circular in outline;

(2) the mass has zero dimension in the plane perpendicular to the wave;

(3) the mass is in the form of a rigidly fixed disc 10;

(4) the disc is set parallel to the direction of propagation of the wave. [Note: Lord Rayleigh (1842–1919) developed a delicately suspended disc which tends to set itself perpendicular to the direction of propagation of a wave. (Albers, Vernon M.: "The World of Sound: A Non-Technical Guide to the Science of Acoustics" 1970, A. S. Barnes & Co. Inc., p. 13)].

It may also be assumed that maximum interference with propagation of a wave by an intervening mass will occur if the mass is in the form of a rigidly fixed disc 10A which is set perpendicular to the direction of propagation of the wave.

Figure 3:
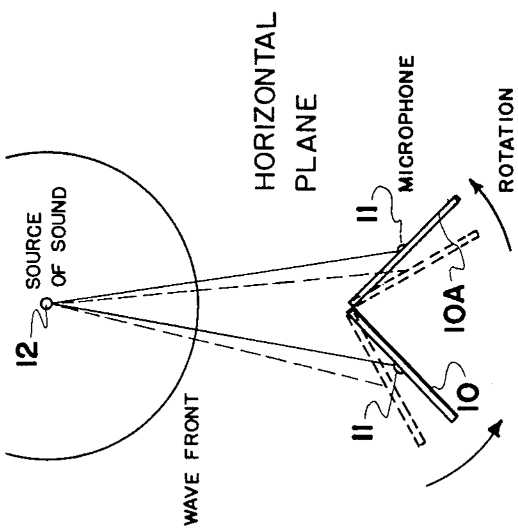
FIG. 3 is a schematic view in a horizontal plane showing two discs set in an angular relationship to one another.

For purposes of locating the source of a sound wave (a point in space), the two discs 10 and 10A may be set in angular relationship to each other. A transducer 11 (microphone) is then set in the centre of the side of each disc facing the propagated wave and the whole structure is then rotated until the distance between the source 12 and the transducers 11 is equal in each case. (See FIG. 3). At this point the intensity of sound at each transducer will be equal and there will be no phase difference.

Figure 5:
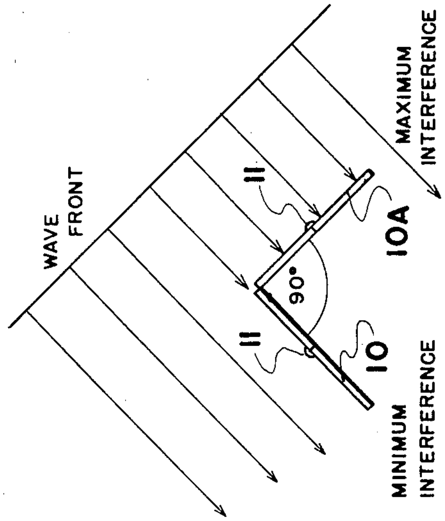
FIG. 5 is a schematic view showing a pair of discs at the optimum angle to one another.

It will be apparent that for this purpose the relationship angle of the two discs 10 and 10A for optimum interference of propagation of a wave is 90° because when one of the discs is providing maximum interference the other disc is providing minimum interference. (See FIG. 5).

Figure 4:
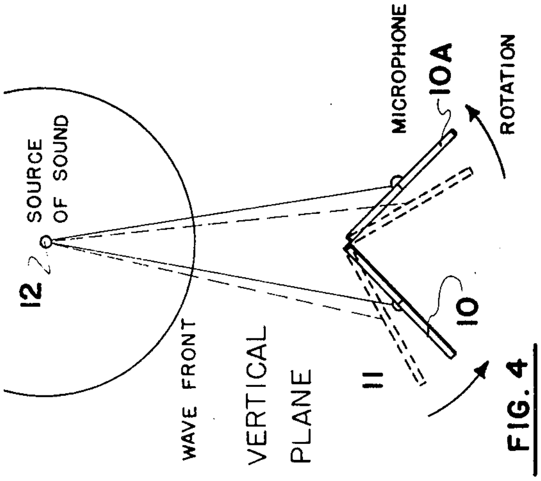
FIG. 4 is similar to FIG. 3, but showing a view in a vertical plane thereof.
Figure 6:
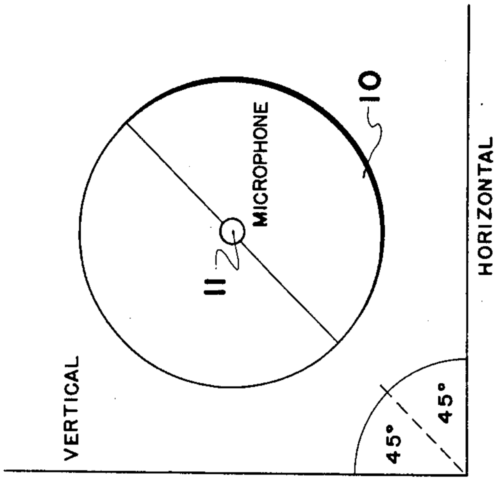
FIG. 6 shows the vertical and horizontal relationship of the desired location of the discs.

The discussion to this point has considered interference with wave propagation as perceived in the horizontal plane and where the plane visualized by the point of contact of the two discs and the points of greatest separation is horizontal. Interference with wave propagation as perceived in the vertical plane and where the plane visualized by the points of contact of the two discs and the points of greatest separation is vertical. (See FIG. 4). As sound waves are propagated spherically, that is, horizontally and vertically, it is apparent that the optimum angle from the horizontal (or vertical) of the plane visualized by the point of contact of the two discs and the points of greatest separation is 45°. For anatomical reasons it is suggested that the structure be conventionally placed with the point of contact of the two discs facing downwards. (See FIG. 6).

In view of the fact that only slight differences in volume and phase are necessary to provide a rather strong feeling of directionality (Schanefield, Daniel: "Four-Channel Sound: What Do You Really Hear?", Audio, November/75, p. 48) and that the present structure is conventionally placed in relation to the anatomy of the human head, we now have a wave-interference omniphonic microphone which permits the detection of the location and direction of the source of sound in all planes and permits the focussing on a specific sound in a field of sounds.

Figure 7:
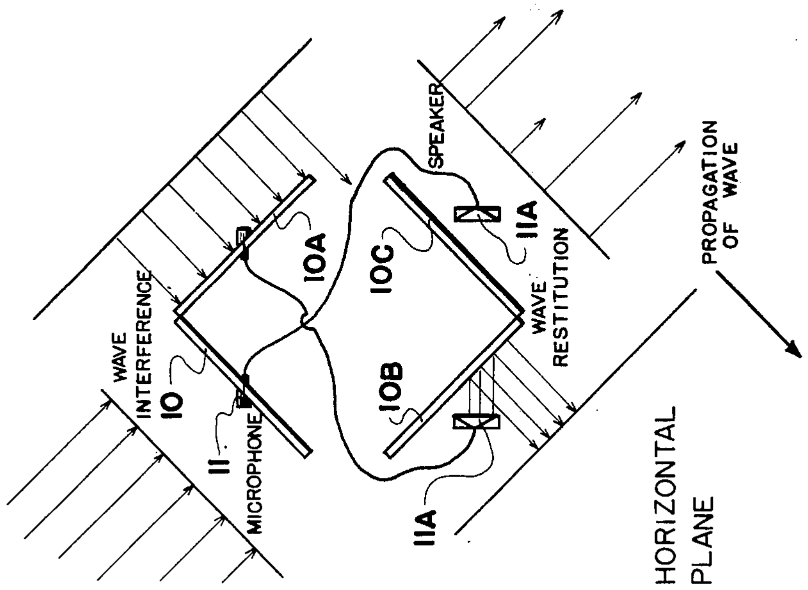
FIG. 7 shows a schematic view in a horizontal plane of a wave-restitution speaker system.

Restitution of the propagated wave is undertaken in a similar fashion. In this case, however, the structure is conventionally placed with the point of contact of the discs facing upwards, transducers 11A (loudspeakers) are placed to reflect the wave from the outwardly facing discs 10B and 10C, and the signal is obtained from the transducer 11 (microphone) of the opposite side. We now have a wave-restitution omniphonic speaker. (See FIG. 7).

To this point, three-dimensional XYZ or c.g.s coordinates have been used as currently used in science and industry, where lines are conveived to be of infinite length and the natural division of the universe is rectangular. R. Buckminster Fuller takes exception to this and suggests that nature coordinates in four planes or dimensions, not three, and that the common angle is 60° not 90°. (R. Buckminster Fuller: "Synergetics: Explorations in the Geometry of Thinking", MacMillan Co., Inc. 1975, 876 pp.).

From this perspective the assumptions are altered as follows:

(1) A mass with zero dimension in a plane perpendicular to the direction of propagation of a wave is conceptually possible but is non-realizable;
(2) A disc, in essence, is a sphere flattened in a line joining two of its opposite poles and perpendicular to its equater;
(3) A sphere is a high-frequency polyhedral system;
(4) The simplest or lowest frequency polyhedral system is the tetrahedron with its four vertexes, four planes and six vectors;
(5) If the edges 13 of the two equilateral triangular surfaces 14 are joined at an angle of 70° 32 minutes, they may be substituted for the two discs set at 90°. Again the optimum angle for vertical and horizontal wave interference is 45°. Two of the three vertexes of each triangular face are now joined. Joining the two remaining vertexes creates a structure whose volumetric domain is in the form of a tetrahedron 15 which can be perceived from within or without. There now is, in the tetrahedron, a point of reference, inherently coordinateable in four dimensions or planes, from which to relate to the world around. The problem is now to go from a four-dimensional configuration to a two-dimensional one i.e., right to left or positive to negative. This is done by placing the transducers at the mid-point 16 of a line 17 joining the midpoints 17A of two edges of each of two panels and where the line of slight 18 between the two transducers is horizontal (see FIG. 10). The transducers 11 are set at 180° from each other, thus facing away from or toward each other. (See FIGS. 8 and 9).

Figure 12:
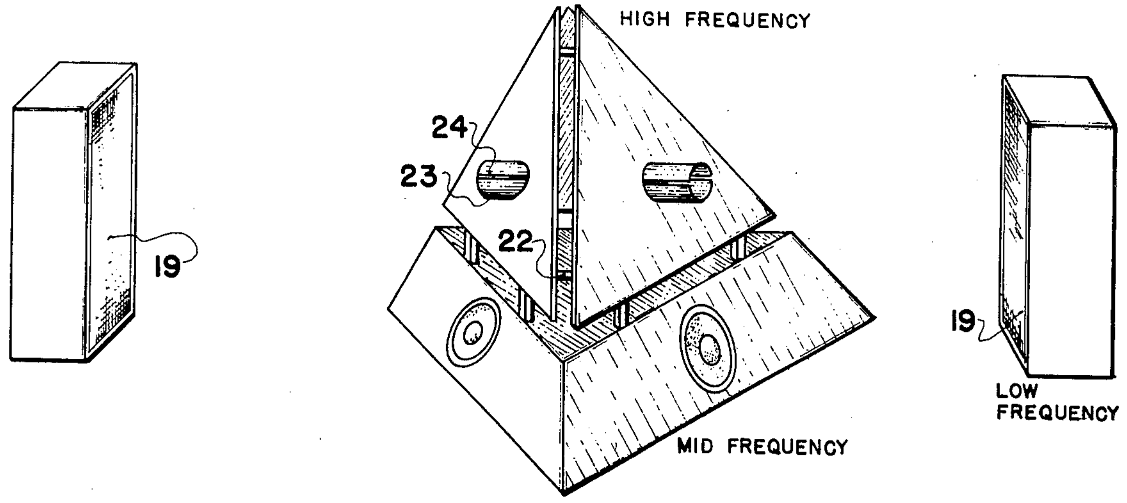
FIG. 12 is a schematic view of an alternative construction showing various frequency range speakers.
Figure 13:
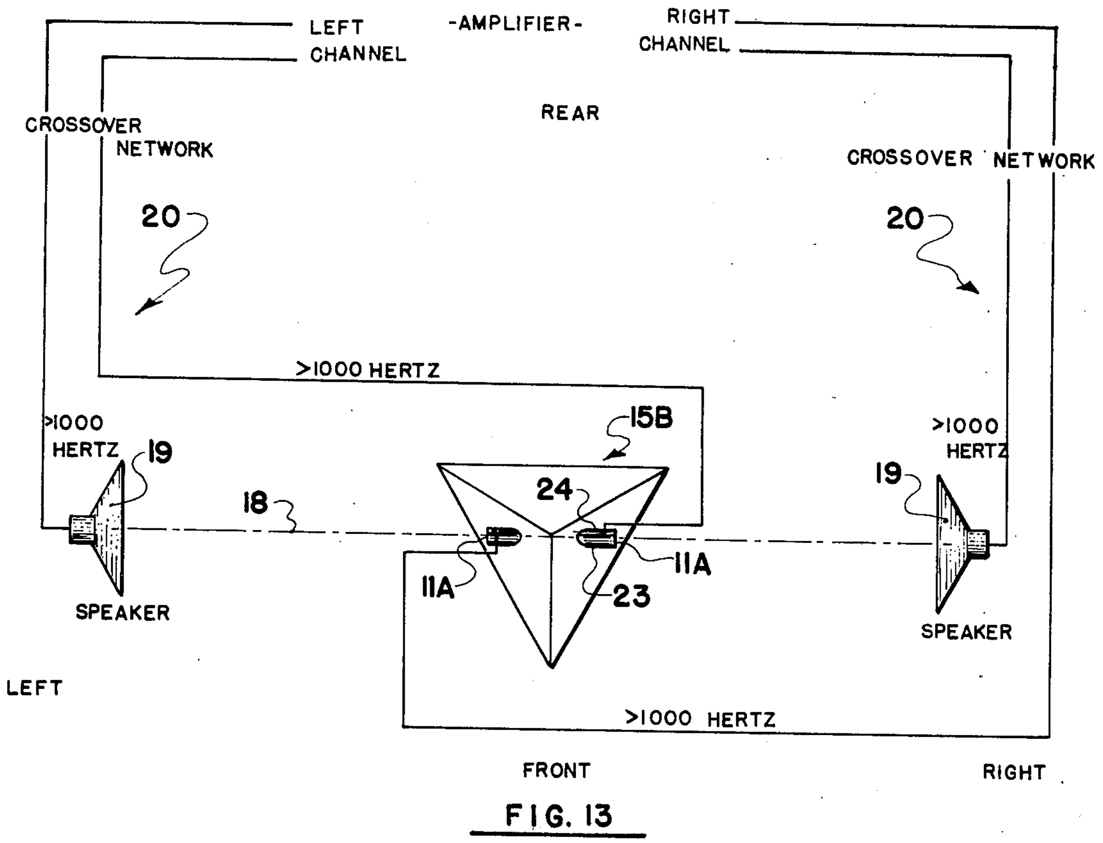
FIG. 13 is a schematic diagram showing the connection for a cross-over network.

There is evidence to suggest that in a loudspeaker system, low and high frequency sounds should be treated separately. McFadden & Pasanen writer: For decades it has been known that the auditory system is provided with two binaural cues for localizing sound sources — interaural time differences and interaural intensity differences — and on the basis of certain physical and psychophysical facts it has been commonly asserted that the two cues are functional in different spectral regions. Interaural intensity differences have been thought to be of value only for high frequencies and interaural time differences only for low frequencies. In part, this belief (sometimes expressed as the duplex theory of sound localization) stemmed from psychophysical research using sinusoidal signals as the waveforms to be localized. For these simplest of waveforms, there is no argument — the auditory system is insensitive to interaural time differences above about 1200 to 1500 Hertz — but many psychoacousticians applied duplex theory to other listening situations as well, and this has recently been shown to have been in error. Recent research shows that more complex waveforms provide the system with a processable time cue in addition to the cycle-by-cycle time differences available with sinusoids. That is, a complex waveform that is time-delayed to one ear provides the auditory system with interaural time differences in the envelope of the waveform, and it is now clear that the auditory system can lateralize just as accurately at high frequencies working on this cue as it can, working on cycle-by-cycle time differences — only a few microseconds are required for excellent performance. (McFadden, Dennis & Pasnen, Edward G., "Binaural Beats at High Frequencies," Science, Vol. 190, No. 4121, Oct. 24, 1975, p. 394). As well, Rayleigh determined theoretically that if a reflector is small compared to the wavelength its effective area as a reflector is less than its actual area. (Albers, Vernon M., "The World of Sound: A Non-Technical Guide to the Science of Acoustics", A. S. Barnes & Co. Inc., 1970, p. 64). Consequently, as shown in FIGS. 12 and 13, with this invention, provision for low-frequency long-wave sound may be provided by the addition of a pair of conventional room speakers 19 where:

(a) the speakers are set facing each other, i.e., at 180° and in the line of sight 18 of the transducers 11A mounted on the tetrahedron;
(b) the speakers are set at opposite phase;
(c) cross-over circuits 20 are introduced to separate the input frequencies at about 1000 Hertz with the low frequencies to the room speakers and the higher frequencies to the transducers 11A mounted on the tetrahedron 15;
(d) the left transducer is connected to the right input channel and the right transducer is connected to the left input channel.

The result is a significant diffusion of sound, greater than that provided by the transducers or room speakers operated separately and is probably a synergistic effect. This applies to both pre-recorded stereophonic material and material recorded with the omniphonic wave interference microphone. When the latter is used the sounds configured in the room around the transducer tend to assume the relationships of their original shape giving a life-like effect.

Figure 8:
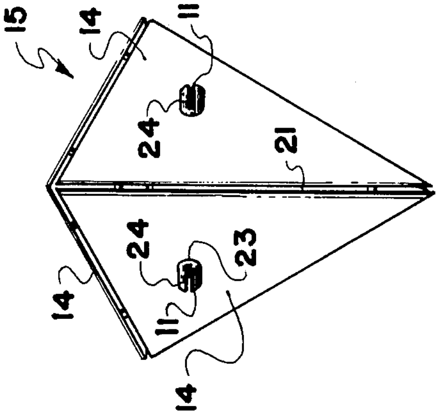
FIG. 8 is a partially schematic representation of the transducer system utilized as an input or microphone module.

In detail, reference should first be made to the input transducer or microphone module shown schematically in FIG. 8.

This consists of the following integers:

Input Transducer

Figure 1:
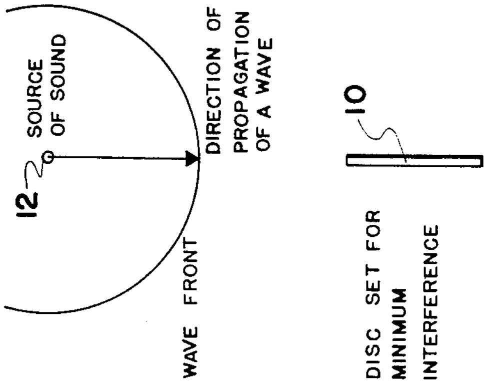
FIG. 1 is a schematic view of a disc set perpendicular to the direction of propagation of a sound wave.
Figure 2:
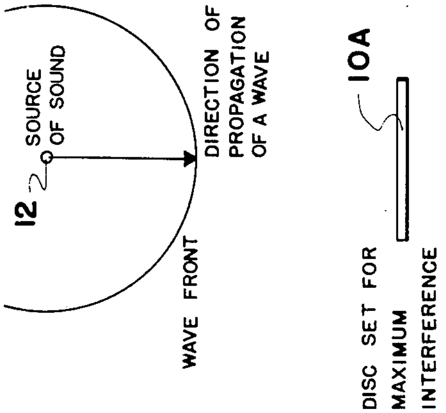
FIG. 2 is a view similar to FIG. 1, but with the disc set parallel to the direction of propagation of the sound wave.
Figure 11:
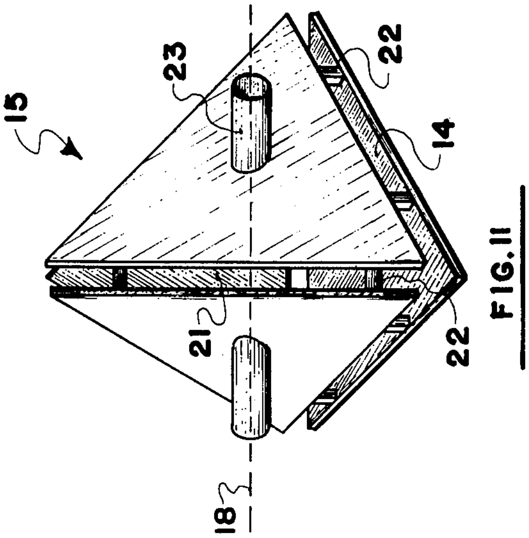
FIG. 11 is an isometric view of one embodiment of the tetrahedron module.

Two "observer" transducer elements 11, i.e., microphones, are set in a horizontal line of sight 18 and facing each other i.e., at 180° rotation one to the other;

Set intermediately between the transducers is a volume of air configured as a regular tetrahedron 15. This is accomplished by setting four triangular panels 14 of equilateral dimension in relation to each other such that a gap 21 remains along each of the six vector edges of the resulting tetrahedral structure;

Bridging support structure 22 may be used as shown in FIG. 11;

The line of sight 18 of the transducers is set to pass through the centre of volume 15A of the tetrahedron. This is accomplished by creating an elliptical opening in the mid-point of a line 17 joining the mid-points 17A of two edges 13 of each panel. The centre points 16 of the elliptical openings constitute the touch-points of two poles of the related vector equilibrium (Fuller, R. Buckminster: "Synergetics: Explorations in the Geometry of Thinking," MacMillan Co. Inc., 1975, 876 pp. See FIG. 470-02B, p. 211). The transducer elements 11 are placed as close to the mid-points 16 of the elliptical openings 22 as is structurally possible.

If truncated cylinders 23 are used as mounting brackets for the transducers 11, lengthwise slitting 24 is required to overcome distortion created by the enclosed resonating column. Because of its inherent horizontal (posterosuperior) bias the posterior and superior panels should be dampened with felt or similar sound-absorbing material (not illustrated).

Alternatively, the triangle edges may be sealed and the transducers may face outwardly through the elliptical openings 22 or the transducers may face a solid tetrahedral structure along the line of sight 18 previously described;

The transducers may be placed back-to-back at the centre of the structure and along the line of sight previously described.

The line of sight 18 of the transducers 11 is identical to the horizontal spin axis of the cube formed by the tetrahedron 15 and its negative (output transducer) and when a line joining one vertex and the centre of the opposite panel is perpendicular to the ground. (Fuller, R. Buckminster: "Synergetics: Explorations in the Geometry of Thinking," MacMillan Co. Inc., 1975, 876 pp. See FIG. 110B, p. 7). Note: for sound recording purposes the vertex of the tetrahedron points vertically downward in a conventional relationship to the human head as perceived in the erect position (see FIG. 8). The tetrahedron can then be seen to yield a "face" with right and left sides, as well as top and rear.

The right and left transducer elements are fed to the corresponding channels of the receiver.

This produces a triaxial or four-dimensional wave-interference transducer.

Output Transducer

The output transducer is the inside-out or converse of the input transducer, so that similar reference characters have been used.

Figure 9:
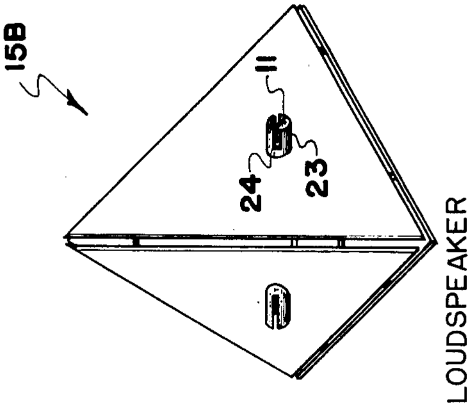
FIG. 9 is a view similar to FIG. 8, but showing the output or loudspeaker module.
Figure 10:
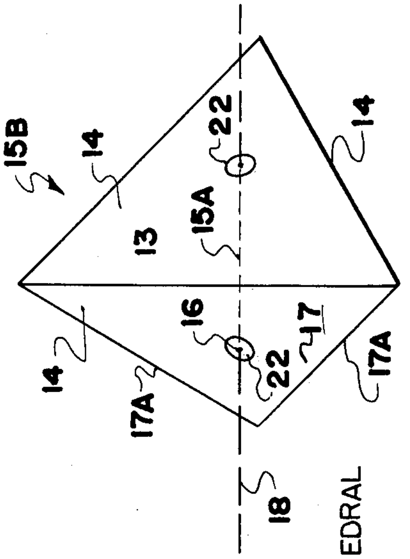
FIG. 10 is a schematic view showing the location of the "line of sight".

Two "reporter" transducer elements 11A, i.e., radio loudspeakers, are set in a horizontal line of sight and facing each other, i.e., at 180° rotation one to the other (See FIG. 9).

Set intermediately between the two transducers is a volume of air configured as a regular tetrahedron 15B. This is accomplished by setting four triangular panels 14 of equilateral dimension in relation to each other such that a gap 21 remains along each of the six vector edges of the resulting tetrahedral structure.

Bridging support structure 22 may be used as shown in FIG. 11.

The line of sight 18 of the transducers 11A is set out to pass through the centre of volume 15A of the tetrahedron. This is accomplished by creating an elliptical opening 22 in each of the two panels. The centre of the lliptical opening is the mid-point of a line joining the mid-points of two edges of each panel. The centre points of the elliptical openings constitute the touch points of two poles of the related vector equilibrium (Fuller, R. Buckminster: "Synergetics: Explorations in the Geometry of Thinking," MacMillan Co. Inc., 1975, 876 pp. See FIG. 470-02B p. 211). The transducer elements are placed as close to the mid-points of the elliptical openings as is structurally possible.

If truncated cylinders 23 are used as mounting brackets for the transducers, lengthwise slitting 24 is required to overcome distortion created by the enclosed resonating column.

Alternatively, the triangle edges may be sealed and the transducers may face outwardly through the elliptical openings or the transducers may face a solid tetrahedral structure along the line of sight previously described.

The transducers may be placed back-to-back at the centre of the structure and along the line of sight as previously described.

The line of sight of the transducers is identical to the horizontal spin axis of the cube formed by the tetrahedron and its negative (input transducer) and when a line joining one vertex and the centre of the opposite panel is perpendicular to the ground. (Fuller, R. Buckminster: "Synergetics: Explorations in the Geometry of Thinking," MacMillan Co. Inc., 1975, 876 pp. See FIG. 110B p. 7). Note: for sound projection purposes the vertex of the tetrahedron points vertically upwards in a negatively conventional relationship to the human head as perceived in the erect position. The tetrahedron can then be seen to yield an inverted "face" but where the right side of the tetrahedron represents the left side of the fact and conversely. As well, the "face" has been rotated one-half turn, or 180°, from the position of the "face" of the input transducer.

The right transducer element is linked to the left output channel of the transmitter and the left transducer element is linked to the right output channel of the transmitter, as shown in FIG. 13.

This produces a triaxial or four-dimensional wave-restitution speaker.

It will therefore be seen that the wave-interference omniphonic microphone and wave-restitution speaker provide an essentially simple system with optimum potential for the retention of the equivalent of reality.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

What I claim as my invention is:

1. A transducer system for use in a sound system comprising in combination a tetrahedron support module, said module including four panels assembled to form said tetrahedron, a pair of transducers mounted one in each of two of said panels which are adjacent one another, said transducers being mounted on a horizontal line of sight and rotated 180° one with the other.

2. The system according to claim 1 in which said panels define a volume of air configured as a regular tetrahedron, said line of sight passing through the center of said volume of air within said tetrahedron.

3. The system according to claim 1 in which said transducers face one another, the edges of each of said panels being spaced apart from the edges of the panels adjacent thereto, thereby defining longitudinally extending gaps between the vector edges of said tetrahedron.

4. The system according to claim 2 in which said transducers face one another, the edges of each of said panels being spaced apart from the edges of the panels adjacent thereto, thereby defining longitudinally extending gaps between the vector edges of said tetrahedron.

5. The system according to claim 1 in which said transducers face outwardly from one another.

6. The system according to claim 2 in which said transducers face outwardly from one another.

7. The system according to claim 1 which includes means to support said transducers on said line of sight, said means comprising elliptical openings formed in said adjacent panels around the mid-point of a line joining the mid-points of any two of the sides of each of said adjacent panels, a truncated cylinder support bracket mounted in said elliptical opening, said transducers being mounted within said support brackets, each of said cylindrical supports being slit lengthwise to overcome distortion created by the enclosed resonating column within said supports.

8. The system according to claim 2 which includes means to support said transducers on said line of sight, said means comprising elliptical openings formed in said adjacent panels around the mid-point of a line joining the mid-points of any two of the sides of each of said adjacent panels, a truncated cylinder support bracket mounted in said elliptical opening, said transducers being mounted within said support brackets, each of said cylindrical supports being slit lengthwise to overcome distortion created by the enclosed resonating column within said supports.

9. The system according to claim 3 which includes means to support said transducers on said line of sight, said means comprising elliptical openings formed in said adjacent panels around the mid-point of a line joining the mid-points of any two of the sides of each of said adjacent panels, a truncated cylinder support bracket mounted in said elliptical opening, said transducers being mounted within said support brackets, each of said cylindrical supports being slit lengthwise to overcome distortion created by the enclosed resonating column within said supports.

10. The system according to claim 4 which includes means to support said transducers on said line of sight, said means comprising elliptical openings formed in said adjacent panels around the mid-point of a line joining the mid-points of any two of the sides of each of said adjacent panels, a truncated cylinder support bracket mounted in said elliptical opening, said transducers being mounted within said support brackets, each of said cylindrical supports being slit lengthwise to overcome distortion created by the enclosed resonating column within said supports.

11. The system according to claim 5 which includes means to support said transducers on said line of sight, said means comprising elliptical openings formed in said adjacent panels around the mid-point of a line joining the mid-points of any two of the sides of each of said adjacent panels, a truncated cylinder support bracket mounted in said elliptical opening, said transducers being mounted within said support brackets, each of said cylindrical supports being slit lengthwise to overcome distortion created by the enclosed resonating column within said supports.

12. The system according to claim 6 which includes means to support said transducers on said line of sight, said means comprising elliptical openings formed in said adjacent panels around the mid-point of a line joining the mid-points of any two of the sides of each of said adjacent panels, a truncated cylinder support bracket mounted in said elliptical opening, said transducers being mounted within said support brackets, each of said cylindrical supports being slit lengthwise to overcome distortion created by the enclosed resonating column within said supports.

* * * * *